(12) United States Patent
Lundell

(10) Patent No.: US 8,560,588 B2
(45) Date of Patent: Oct. 15, 2013

(54) DIGITAL PULSE REJECT COUNTER

(75) Inventor: Thomas D. Lundell, Lakeville, MN (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 2148 days.

(21) Appl. No.: 11/529,408

(22) Filed: Sep. 28, 2006

(65) Prior Publication Data

US 2008/0079630 A1 Apr. 3, 2008

(51) Int. Cl.
*G06F 17/10* (2006.01)

(52) U.S. Cl.
USPC .......................................... 708/300; 327/310

(58) Field of Classification Search
None
See application file for complete search history.

(56) References Cited

U.S. PATENT DOCUMENTS

| | | | |
|---|---|---|---|
| 3,822,385 A | | 7/1974 | Kayalioglu |
| 4,086,538 A | * | 4/1978 | Foreman ......................... 327/38 |
| 4,266,099 A | * | 5/1981 | Kayalioglu et al. .......... 375/214 |
| 4,775,840 A | * | 10/1988 | Ohmori et al. .................. 327/34 |
| 6,337,649 B1 | * | 1/2002 | Becker et al. ................. 341/155 |
| 2007/0279037 A1 | | 12/2007 | Jouve |

OTHER PUBLICATIONS

EP07117500.4 The Extended European Search Report, Jul. 12, 2010.

* cited by examiner

*Primary Examiner* — Michael D Yaary
(74) *Attorney, Agent, or Firm* — Fletcher Yoder, P.C.; R. Scott Speroff; John M. Miller

(57) ABSTRACT

A system and method are provided for filtering noise from a pulsed input signal comprising cyclically producing a change in an output signal only if changes in an input signal occur at least a desired time after a respective immediately previous change in the input signal, and otherwise rejecting the changes in the input signal; and counting the rejected changes in the input signal. More than one duration or frequency may be used for the filtering, enabling classification of noise by frequency. Resulting counts may be used to determine rates of occurrence of noise for evaluation of performance of equipment, installation of the equipment, and changes in performance over time.

20 Claims, 3 Drawing Sheets

DIGITAL PULSE REJECT COUNTER

BACKGROUND

The present invention relates generally to noise detection in sensed signals. Particularly, this invention relates to a system and method for digitally counting rejected noise signals provided by a motor drive or other sensor.

Motors operated in certain industrial settings are typically monitored for their in-line operational parameters so as to ensure their proper on-going operation, as well as for preempting motor malfunctions. Such in-line parameters may include motor speed, motor shaft angle, motor position and so forth. Detection of such parameters typically requires coupling sensors to the motor for detecting mechanical, thermal or electrical signals produced by or provided to the motor, from which various metrics are obtainable. Such metrics may provide indicators of certain operational states of the motor.

Electrical signals produced by motor-coupled sensors are typically susceptible to noise. Such noise may originate from the motor itself or from sources exterior to the motor, such as electrical wiring leading to or from the motor, wiring to and from the sensors to the motor, and wiring between the motor to motor monitoring units. Other ambient sources may include randomly produced electrical sources disposed in the vicinity of the motors and sensors. Current signal detection systems of motor motoring units are configured to detect signals, including noise related signals, such as by detecting whether time durations of pulses contained within the signal are longer than a certain threshold. Accordingly, pulses with time durations shorter than the threshold may be rejected by the detection system and, moreover, may not be registered, such that the number of pulses rejected by the detection system is not accounted for. In most instances, such pulses originate from noise which may go unregistered as motor performance is being monitored. By not counting the rejected noise signals, motor monitoring systems may be deprived of useful information obtainable from the rejected noise signals to the extent that uncertainties regarding maintenance of the motor and imminent malfunctions thereof may arise. Similarly, the nature and source of noise-causing disturbances are not appreciated, and in fact, are generally unknown due to the fact that noise itself is simply unappreciated.

There is a need in the art for improved techniques for monitoring noise in these and other systems. The technique is particularly needed in automation settings where noise can greatly affect the ability to monitor and control loads, and where some or most noise sources could be avoided if they were recognized and appreciated as such. Further, statistical analysis of rejected noise pulses is needed to provide a leading indicator of increasing noise levels, as well as a figure-of-merit to compare the noise levels from one system installation to another.

BRIEF DESCRIPTION

The present invention provides a system and a method designed to respond to such needs. The present technique is based upon the use of a digital pulse rejection counter that is configured to classify and quantify rejected noise pulses generated by sensors coupled to a load, such as a motor. Accordingly, the system and method enable counting rejected pulses by employing predetermined thresholds configured to classify such pulses according to their time durations. In this manner, it is possible to distinguish between different types of noise signals indicative of various processes occurring in the load or in the vicinity thereof. Such a system and method can help assess the performance of the motor, as well as diagnose and preempt present and future malfunctions associated with motor operability. The information is also highly useful in evaluating factors leading to noise, such as installation of wiring, degradation of wiring, local disturbance sources, and so forth.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
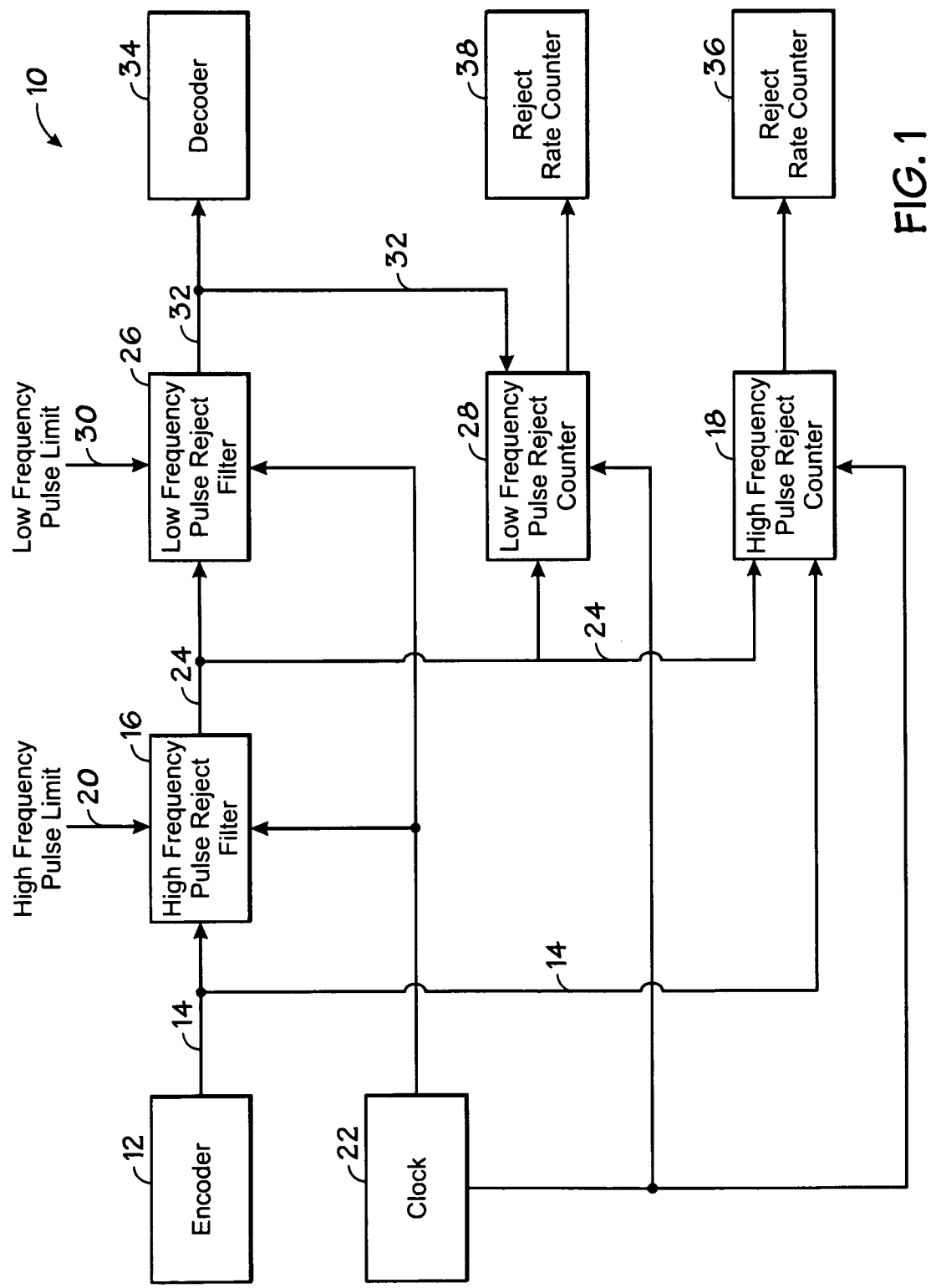
FIG. 1 is an exemplary circuit diagram of a pulse rejection counter in accordance with aspects of the present technique.

Turning now to the drawings, and referring first to FIG. 1, a block diagram is shown of an exemplary digital pulse rejection counter system 10, in accordance with an embodiment of the present technique. System 10 may be part of a motor monitoring system configured to monitor signals produced by sensors coupled to the motor. More generally, however, system 10 may be applied to any suitable load. In the illustrated embodiment, system 10 is configured to filter out, (i.e., reject) noise signals above predetermined frequency limits and to count the number of such rejected noise signals. In so doing, system 10 is configured to classify and quantify noise signals according to their frequency ranges (i.e., the duration of time between one signal change [tdl1] and a subsequent signal change).

System 10 includes an encoder 12 configured to digitally encode signals obtained from a sensor component coupled to a motor. Signals encoded by encoder 12 may comprise, for example, motor speed, motor position, motor shaft angle, and so forth. Once encoded, output signals 14 are provided to a high frequency pulse reject filter 16 that operates in conjunction with a high frequency pulse reject counter 18. High frequency pulse reject filter 16 is further provided with a high frequency pulse limit 20, used by filter 16 as a threshold for filtering out signals having frequencies greater than high frequency pulse limit 20. In addition, high frequency pulse reject filter 16 and high frequency pulse reject counter 18 are provided with a clock signal 22, used for measuring durations of encoded signals 14. In this manner, frequencies of pulses comprising output signals 14 are determined and compared to limit 20. This enables for system 10 to determine whether such pulses should be rejected.

Output filtered signals 24 provided by high frequency pulse reject filter 16 are made for all signals having a frequency below the high frequency threshold 20. In a presently contemplated implementation shown, signals 24 are thereafter provided for the high frequency pulse reject counter 18, a lower frequency pulse reject filter 26 and a lower frequency pulse reject counter 28. The lower frequency pulse reject filter 26 operates in conjunction with the lower frequency pulse reject counter 28. Further lower frequency pulse reject filter 26 is provided with a lower frequency pulse limit 30, used by filter 26 for filtering out pulses having a frequency greater than lower frequency threshold 30. Like high frequency pulse reject filter 16 and reject counter 18, lower frequency pulse reject filter 26 and lower frequency pulse reject counter 28, respectively, are provided with clock signal 22 for measuring the frequency of pulses comprising signal 24. Filter 26, thus, compares the frequency of signal 24 to that of threshold 30 to determine whether signal 24 should be rejected. Thereafter, filtered signals 32 are provided to a decoder 34 and to lower frequency pulse reject counter 28.

While provided with both encoded signals 14 and filtered signals 24, the high frequency pulse reject counter 18 counts the number of pulses contained in each of signals 14 and 24. Counting the number of pulses in each of signals 14 and 24 may be done by detecting the leading edge of each pulse contained within signals 14 and 24. In so doing, counter 18 may, for example, subtract the number of pulses 24 from those obtained from signal 14 to obtain a net number of pulses rejected by high frequency filter 16.

In a similar manner, the lower frequency pulse reject counter 28 may utilize filtered signals 24 and lower frequency filter signals 32 to obtain a count of number of pulses rejected by filter 26. Thus, lower frequency pulse reject counter 28 may subtract the number of pulses contained in signals 32 from those contained in signals 24 to obtain a net number of low frequency pulses rejected by lower frequency reject filter 26.

It should be noted that, as used herein, the terms "high" and "lower" are intended to signify relative limits or ranges that may represent noise in a particular system. It will be apparent to those skilled in the art that the particular frequency or duration between signals that will be considered as noise, as opposed to acceptable data, may vary, sometimes widely, between systems, equipment, applications of the same systems and equipment, and even based on set operating parameters of the systems. Indeed, the present technique may be implemented in software that permits setting of the limits defining noise.

It should also be noted that by having high and low frequency pulse reject filters, such as filters 16 and 26, coupled to reject counters 18 and 28, respectively, digital pulse rejection counter system 10 provides for noise classification. Hence, system 10 enables determining the number of rejected pulses rejected as noise, as well as a determination of why the pulses were rejected. That is, the system determines whether pulses determined to represent noise were rejected because their frequency was above a first limit, or because their frequency was below the first limit but above a second, lower limit. In the present implementation, this is equivalent to determining whether a pulse in a pulse string was received a time duration after an immediately preceding pulse that was shorter than a first limit, or that was longer than the first limit, but shorter than a second limit.

In so doing, system 10, effectively, classifies the noise signals according to their frequency ranges which may correspond to sources from which noise signals originate. For example, counting pulses rejected by filter 16, via counter 18, may form a diagnostic indicator corresponding to the amount of noise generated from within the motor itself. Similarly, if the number of pulses obtained by lower frequency reject counter 26 may become too excessive, then this, for example, may be an indication that the levels of ambient noise are elevated, which would have no bearing on the operational state of the motor. Accordingly, by having at least two filters, such as filters 16 and 26 coupled to counters 18 and 28, respectively, system 10 may discern among various types of noise pulses, some of which may or may not be associated with the functional state of the motor. In some situations, it may be desirable to obtain a pulse rejection rate based on the counts provided by counters 18 and 28. Accordingly, the counters 18 and 28, may each be connected to reject rate counters 36 and 38, respectively. Reject counters 36 and 38 may be configured to provide a number of pulses rejected per certain periods of time (e.g., per minute, per hour, per day). It should also be noted that, where such classification is not useful, a single reject counter may be employed with a single filter. Conversely, more than two such filters and counters may be used for even more resolution in the classification of noise frequency.

Figure 2:
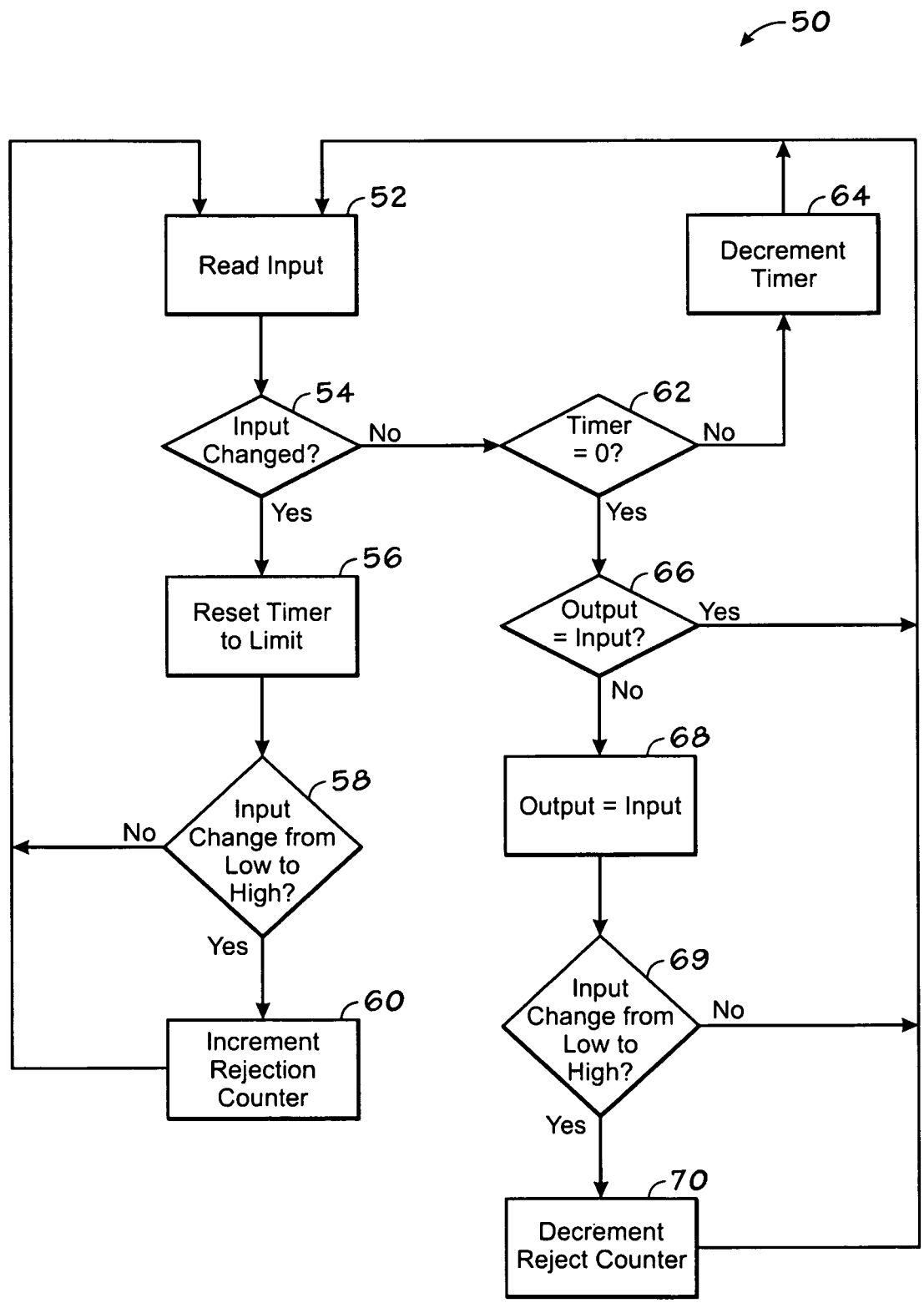
FIG. 2 is an exemplary block diagram of a routine implemented by a pulse rejection counter in accordance with an aspect of the present technique.

FIG. 2 is a flow chart 50 of a method implemented by a digital pulse rejection counter, in accordance with an exemplary embodiment of the present technique. As will be appreciated by those skilled in the art, the diagram of FIG. 2 is intended simply to summarize the operation of the system, which could be analyzed or represented differently, and that will typically be encoded in a memory device as instructions implemented by a processor in a motor (or more generally a load) monitoring or controlling device. Such memory and processors may be generally of any known type, such as those provided in convention motor or load controls (e.g., on feedback loops from sensors, encoders, and so forth). Similarly, the filters, limits and counters may also typically be implemented by software in such devices.

The method begins at block 52 labeled "read input," whereby an input signal is detected by the pulse rejection counter. Thereafter, the method proceeds to decision junction 54 labeled "input change?" to determine whether a change from the previous input signal has occurred. If so, a pulse is detected and the method proceeds from decision block 54 to block 56 labeled "reset timer," so as to reset the timer to the pulse limit to count the duration length of the detected signal (i.e., from the received signal to a subsequent change in the input). Thereafter, the method proceeds to decision block 58 labeled "input changes from low to high?" to determine whether the pulse comprises a rising edge. At this stage, other embodiments of the present technique may utilize high to low changes to determine whether the pulse comprises a dropping edge. As further discussed below, pulse rejection counter 10 (FIG. 1) may employ decision junction 58 of method 50 such that a rising edge or, as in alternative embodiments, a dropping edge of a pulse increments a pulse rejection counter, such as rejection counter 10. Thus, if no rising edge is detected, the method proceeds back to block 52 and the process restarts. However, if the input pulse comprises amplitude changing from low to high, then a rising edge is detected and the method proceeds to block 60 labeled "increment rejection counter". Accordingly, in block 60, the rejection counter is incremented to indicate that a pulse has been counted by the pulse rejection counter. From block 60, the method returns back to block 52.

Returning to decision junction 54, if no change occurs in the input signal such that no pulse is detected, the method proceeds from decision junction 54 to decision junction 62, labeled "timer equal to zero?" Thus, implementing decision junction 62 may determine whether a time set by a timer limit corresponding to a valid pulse has elapsed such that the pulse may be considered as a valid pulse, i.e., one that is not considered to represent noise and is thus not rejected. If not, the method proceeds to block 64, reading "decrement timer," whereby the method loops back to block 52. If the timer reaches zero, the method proceeds from decision junction 62 to decision junction 66, labeled "output equal to input?," to determine whether the input and output are equal. If the output is equal to the input, then no change has occurred and the method loops back to block 52. If, however, a change in the signal occurred and the output is no longer equal to the input, then the method proceeds from block 66 to block 68, labeled "output equal to input," such that the output is set equal to the input. From block 68 the method proceeds to decision junction 69 labeled "input changes from low to high?" to determine whether the pulse comprises a rising edge. At this stage, other embodiment of the present technique may utilize high to low changes to determine whether the pulse comprises a dropping edge. As further discussed below, pulse rejection counter 10 (FIG. 1) may employ decision junction 69 of method 50 such that a rising edge of a pulse or, as in alternative embodiments, a dropping edge of a pulse increments a pulse rejection counter, such as rejection counter 10. Thus, if no rising edge is detected, the method proceeds back to block 52 and the process restarts. However, if the input pulse comprises amplitude changing from low to high, then a rising edge is detected and the method proceeds to block 70, labeled "decrement reject counter." Accordingly, this is indicative of a valid pulse, i.e., a pulse which is not rejected by the digital pulse reject counter. From block 70, the method loops back to block 52. Thus, while the counter is incremented each time a pulse is received, by decrementing the counter when a pulse is classified as "valid" or "not noise", the counter effectively keeps a count of the pulses rejected as noise.

Figure 3:
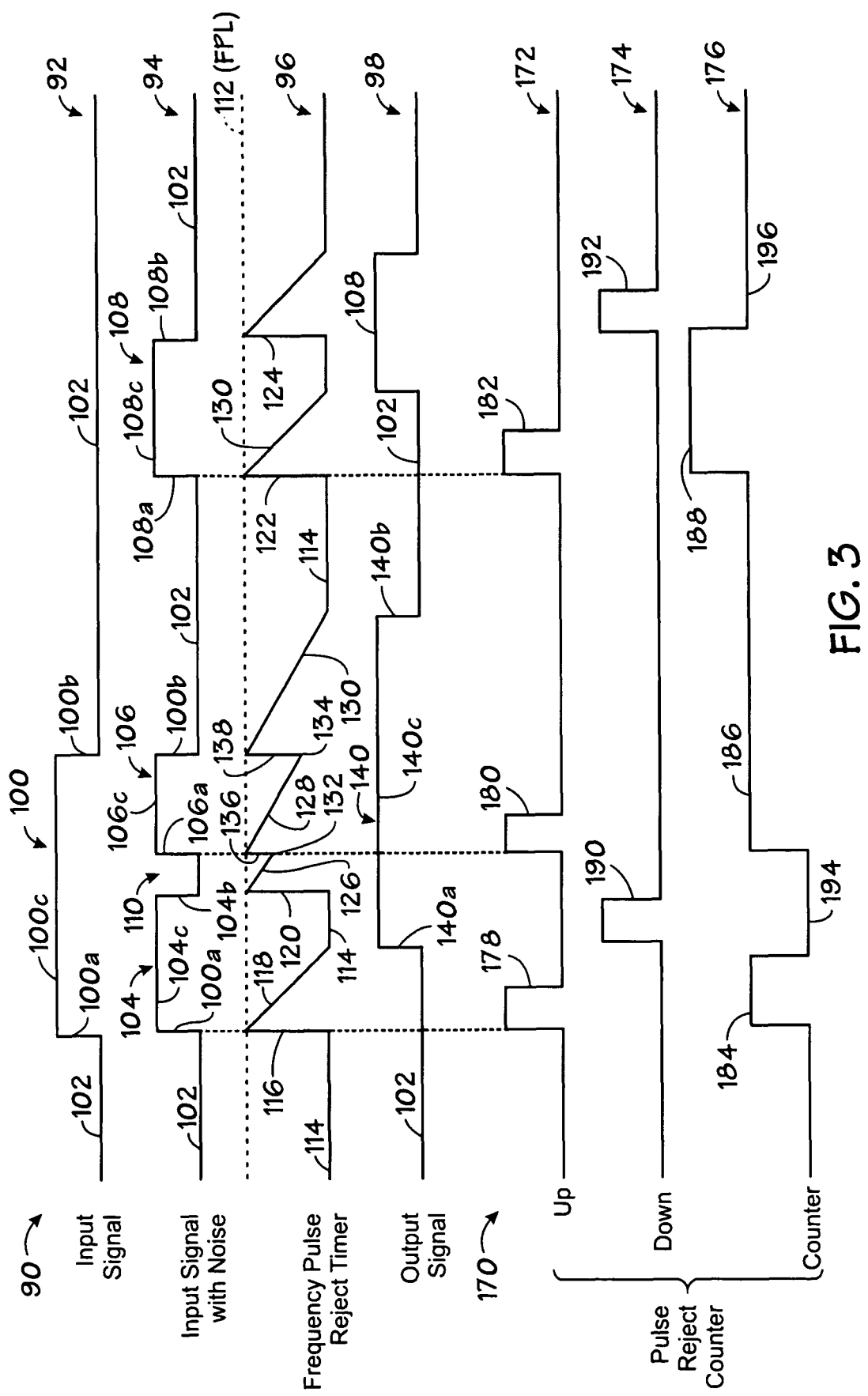
FIG. 3 is a graphical representation of traces of input, output and timing signals as implemented by a pulse rejection counter in accordance with an exemplary embodiment of the present technique.

FIG. 3 is a graphical depiction of traces of the manner in which the digital pulse reject counter system described above operates, in accordance with an exemplary embodiment of the present technique. The upper portion of FIG. 3 includes time trace 90 including separate time traces 92-98. Accordingly, trace 92 depicts a square wave pulse train over time, and having magnitudes ranging from zero to one (or more generally, low to high). Accordingly, trace 92 may represent an ideal simplified depiction of pulses arising from signals provided by sensors coupled to a motor. Such signals may represent various parameters relating to the functional state of the motor, such as motor speed, motor shaft position, motor shaft angle and so forth. Trace 94 depicts the same pulse train shown in trace 92, but partitioned in due to noise. Thus, graph 94 includes two separate noise pulses, augmenting the original pulse shown in trace 92. In this manner, trace 94 illustrates realistic signals such as those that could be provided by sensors coupled to a motor representing typical motor operation.

Trace 96 includes timer values provided by a frequency pulse reject timer for measuring the time durations of pulses given by traces 92 and 94. Trace 98 illustrates an output signal resulting after certain pulses are rejected from trace 94. Such pulse rejection may be achieved by a digital pulse reject counter, such as the one depicted in FIG. 1. As illustrated by FIG. 3, traces 92-98 all coincide in their time scale so as to enable their comparison when implementing pulse rejection counting.

Referring again to trace 92, the trace includes a pulse 100 having a rising edge 100a, a falling edge 100b and a constant amplitude region 100c contained therebetween with amplitude of unity (high). Exterior to pulse 100, trace 92 comprises region 102 having amplitude of zero (low). Graph 94 illustrates pulse 100 as being modified by a noise signal to the extent that pulse 100 appears to be partitioned into two separate pulses, namely, pulses 104 and 106. Further, a noise pulse 108 augments the original pulse 100 such that it appears sequentially after the original pulse 100. Pulse 104 retains the original rising edge 100a, but has a falling edge 104b due to a noise signal 110. Pulse region 104c depicts a region where pulse 104 has amplitude of unity, contained between the rising and falling edges 100a and 104b, respectively. Similarly, pulse 106 includes rising and falling edges 106a and 100b, respectively, and region 106c contained therebetween having a magnitude of unity. In addition, noise pulse 108 contains rising and falling edges 108a and 108b, respectively, and region 108c contained therebetween having amplitude of unity.

Trace 96 includes depictions of timer increments whose amplitude ranges anywhere between zero and a value corresponding to a frequency pulse limit (FPL) 112. For example, when filtering pulses with high frequency, the FPL 112 may be set by the filter 16 according to the threshold 20, as shown in FIG. 1. As will be appreciated by those of ordinary skill in the art, the timer signals shown in trace 96 may in principle apply to the lower and high frequency filters shown in FIG. 1.

Accordingly, trace 96 includes region 114 representing a state of the timer as it is set to zero. Vertical line 116 depicts a region representing the timer as it transitions to a higher state, i.e., to its maximum value set by FPL 112. That is, the timer is reset to FPL 112 so that an accurate determination can be made of the duration of a pulse. Accordingly, line 118 of trace 96 illustrates a region representing a countdown of the timer as reaches a zero value, i.e., level 114. Such a full incremental countdown of the timer per pulse corresponds to a non-rejected or "valid" pulse, that is, a pulse that is received a sufficient duration after an immediately preceding pulse. Stated otherwise, the frequency of the aforementioned pulse is below a frequency threshold, such as threshold 20 or 30 of FIG. 1, and constitutes a non-rejected pulse.

Similar to vertical line 116, lines 120, 122 and 124 correspond to those regions in which the timer is reset from 0, i.e., level 114, to FPL 112. Regions 126, 128 and 130 correspond to those regions where the timer counts down so as to measure durations of pulses, such as those depicted in trace 94. Points 132 and 134 correspond to transition points in the timer signal induced by a change in the input signal while the timer counts down, causing the timer to be reset to FPL 112, as indicated by lines 136 and 138. Transitions 132 and 134 correspond to sensor pulses that are rejected by the digital pulse reject counter. As shown in FIG. 3, rising or lowering edges of pulses, such as pulses 104-108, prompt the timer to be reset to FPL 112, in accordance with the logic summarized in FIG. 2.

As mentioned above, trace 98 depicts output pulses resulting from certain pulses rejected in trace 94. Accordingly, trace 98 depicts pulse 140 having rising and falling edges 140a and 140b and region 140c of constant magnitude. Trace 140 further depicts non-rejected noise pulse 108. The pulses 140 and 108 of trace 98 are depicted as time-delayed compared to the pulses of traces 92-96. Such a time delay may be an artifact resulting from waiting for the timer to time out as it times pulse durations.

Overviewing the pulse rejection process, beginning in region 102 the input signal is found to be at a zero level and the timer has not been reset, as indicated by region 114. Rising edge 100a prompts resetting of the timer as it transitions from level 114 to level 112, as indicated by reference numeral 116. Thereafter, the timer times down, as indicated by line 118, to level 114. This time corresponds to duration between pulses that would be indicative of a valid or non-rejected pulse. Consequently, the output signal 98 transitions from zero to one.

Sequentially proceeding to noise pulse 110 of trace 94, falling edge 104b prompts the timer to be reset once more as it transitions from level 114 to level 112. As the timer times down, the duration of the noise pulse 110 is not sufficient to allow full timing out of the timer and, therefore, pulse 110 does not constitute a valid non-rejected pulse, and will be rejected (i.e., will not result in a change of state of the output signal). That is, the timer is reset before it times out to level 114. Accordingly, rising edge 106*a* of trace 94 prompts a reset of the timer as it transitions from point 126 to FPL 112 via line 136. Once again, the timer will begin timing down, as indicated by line 128 to point 134, as the falling edge 100*b* is reached without reaching zero level 114, prompting the counter to again be reset, as indicated by line 138. During the incremental duration extending from line 140*a* to point 134, no change in the output is indicated as it remains at a value of unity. This is so because the timer countdown extending in the aforementioned time period never reaches zero level 114. Consequently, noise pulse 110 is rejected.

The above description equally applies to noise pulse 108 as shown via its corresponding timer and output regions of traces 96 and 98, respectively. Thus, in contrast to rejected noise pulse 110, noise pulse 108 is not rejected because its time extension permits the timer to fully time out from the level 112 down to zero level 114, as shown by trace 96. In embodiments where the FPL is set according to a low frequency limit, the duration of pulse 108 may be short enough to render the pulse 108 non-valid, i.e., rejected. In this manner, adjusting the FPL 112 may be used by the pulse rejection counter as a mean for discriminating pulses.

The lower part of FIG. 3, showing a set 170 of traces that, describe the manner by which a digital pulse reject counter operates, in accordance with exemplary embodiment of the present technique. Accordingly, set 170 includes traces 172 and 174 representing incrementing and decrementing the counter, respectively. Set 170 further includes trace 176 representing the value of the digital pulse reject counter obtained by incrementing and decrementing the counter.

Referring to trace 172 and to signal 94 of FIG. 3, the counter is incremented whenever the input signal 94 contains a rising edge. Thus, increments 178-182 correspond to rising edges 100*a*, 106*a* and 108*a* of FIG. 3. Increments 178-182 in this counter are reflected in increments to the digital reject counter, as indicated by reference numerals 184-188.

Referring to trace 174 and to signal 98 of FIG. 3, decrements in counter are registered whenever the output signal 98 contains a rising edge. Thus, increments 190 and 192 correspond to the rising edges 140*a* and 108*a* of FIG. 3. Decrements 190 and 192 thus result in decrementing the pulse reject counter, as indicated by reference numerals 194 and 196 for the trace 176. By incrementing the pulse reject counter for every rising edge in the input signal 94, and by decrementing the pulse reject counter 176 for every valid output signal produced, a total count of rejected pulses is obtained, as seen by trace 176.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A method for filtering noise from a pulsed input signal comprising:
    using a processor to execute computer instructions encoded on a memory device, wherein the computer instructions comprise instructions for:
        cyclically producing a change in an output signal only if an input signal does not change for at least a desired time after a previous change in the input signal, and otherwise rejecting the previous change in the input signal; and
        counting the rejected changes in the input signal to classify noise signals in the input signal according to frequency ranges.

2. The method of claim 1, wherein the computer instructions comprise instructions for incrementing a count of the rejected changes with each leading edge change in the input signal, and decrementing the count with each leading edge change in the output signal, the resulting count representing the number of rejected changes in the input signal.

3. The method of claim 1, wherein the desired time is user adjustable.

4. The method of claim 1, wherein each time a change occurs in the input signal, a timer is reset, and the output signal is changed only when the timer reaches a predetermined threshold.

5. The method of claim 1, wherein the rejected changes in the input signal are representative of noise.

6. The method of claim 1, wherein the computer instructions comprise instructions for periodically reading the count of the rejected changes to determine a rate of rejection of the changes in the input signal.

7. The method of claim 6, wherein the rate of rejection is representative of relative noisiness of the input signal.

8. The method of claim 1, wherein the input signals are output from a position encoder.

9. The method of claim 1, wherein the computer instructions comprise instructions for incrementing a count of the rejected changes with each rising edge in the input signal, and instructions for decrementing the count with each rising edge in the output signal, the resulting count representing the number of rejected changes in the input signal.

10. A method for filtering noise from a pulsed input signal comprising:
    using a processor to execute computer instructions encoded on a memory device, wherein the computer instructions comprise instructions for:
        cyclically producing a change in a first output signal only if an input signal does not change for at least a first desired time after a previous change in the input signal, and otherwise rejecting the previous change in the input signal;
        counting the rejected changes in the input signal based on the first desired time;
        cyclically producing a change in a second output signal only if the first output signal does not change for at least a second desired time after a previous change in the first output signal, and otherwise rejecting the previous change in the first output signal;
        counting the rejected changes in the first output signal based on the second desired time; and
        using the counts of rejected changes in the input signal and the first output signal to classify noise signals in the input signal according to frequency ranges.

11. The method of claim 10, wherein the rejected changes in the input signal and the first output signal are representative of noise below two different frequencies corresponding respectively to the two different desired times.

12. The method of claim 10, wherein the computer instructions comprise instructions for periodically reading the counts of the rejected changes to determine rates of rejection of the changes.

13. The method of claim 12, wherein the rates of rejection are representative of relative noisiness of the input signal below two different frequencies corresponding respectively to the two different desired times.

14. A method for filtering noise from a pulsed input signal comprising:

using a processor to execute computer instructions encoded on a memory device, wherein the computer instructions comprise instructions for:
classifying noise in an input signal into at least two different frequency classifications based upon time of occurrence of changes in the input signal and at least two different time thresholds; and
determining relative noisiness of the input signal at the two different classifications based upon rates of rejection of noise at the different classifications.

15. The method of claim 14, wherein the noise is classified by counting a number of rejected changes in the input signal at each of the frequency classifications.

16. The method of claim 15, wherein the rejected changes in the input signal are determined for each frequency classification by cyclically producing a change in an output signal only if the input signal does not change for a desired time corresponding to the respective frequency classification after a previous change in the input signal, and otherwise rejecting the previous change in the input signal.

17. A system for filtering noise from a pulsed input signal comprising:
a memory device having computer instructions encoded thereon, wherein the computer instructions comprise:
a filter for cyclically producing changes in an output signal only if an input signal does not change for at least a desired time after a previous change in the input signal, and otherwise rejecting the previous change in the input signal; and
a counter for counting the rejected changes in the input signal to classify noise signals in the input signal according to frequency ranges.

18. The system of claim 17, wherein the counter is incremented with each leading edge of a change in the input signal, and decremented with each leading edge of a change in the output signal, the resulting count representing the number of rejected changes in the input signal.

19. The system of claim 17, further comprising a second filter that rejects changes in the output signal if the output signal changes before a second desired time after a previous change in the output signal, and a second counter for counting the rejected changes in the output signal.

20. The system of claim 17, wherein the desired time is user adjustable.

* * * * *